(12) United States Patent
Choi et al.

(10) Patent No.: US 8,673,522 B2
(45) Date of Patent: Mar. 18, 2014

(54) METHOD FOR MANUFACTURING PHOTOMASK AND PHOTOMASK MANUFACTURED USING THE SAME

(75) Inventors: Jin Choi, Yongin-si (KR); Byung-Gook Kim, Seoul (KR); Hee-Bom Kim, Hwaseong-si (KR); Sang-Hee Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 23 days.

(21) Appl. No.: 13/571,043

(22) Filed: Aug. 9, 2012

(65) Prior Publication Data

US 2013/0143150 A1    Jun. 6, 2013

(30) Foreign Application Priority Data

Dec. 2, 2011    (KR) .................... 10-2011-0128563

(51) Int. Cl.
*G03F 1/38*    (2012.01)

(52) U.S. Cl.
USPC ................. 430/5; 430/30; 430/296; 430/942; 382/144

(58) Field of Classification Search
USPC .................. 430/5, 30, 296, 942; 382/144
See application file for complete search history.

(56) References Cited

U.S. PATENT DOCUMENTS 6,649,920 B1    11/2003    Tamura

FOREIGN PATENT DOCUMENTS

| JP | 09-260254 | 10/1997 |
|----|-----------|---------|
| JP | 2001-265012 | 9/2001 |

OTHER PUBLICATIONS

English Abstract for Publication No. 09-260254.
English Abstract for Publication No. 2001-265012.

*Primary Examiner* — Christopher Young
(74) *Attorney, Agent, or Firm* — F. Chau & Associates, LLC (57) ABSTRACT

A method for manufacturing a photomask includes forming a photoresist film on a substrate, and forming a defect detecting pattern on the photoresist film. The defect detecting pattern has a first pattern elongated in a first direction and a second pattern overlapping one end of the first pattern and elongated in a second direction different from the first direction. The first pattern and the second pattern are formed using electron beams (e-beam) diffracted by a same amplifier.

14 Claims, 12 Drawing Sheets

METHOD FOR MANUFACTURING PHOTOMASK AND PHOTOMASK MANUFACTURED USING THE SAME

CROSS-REFERENCE TO RELATED APPLICATION

This application claims priority from Korean Patent Application No. 10-2011-0128563 filed on Dec. 2, 2011 in the Korean Intellectual Property Office, and all the benefits accruing therefrom under 35 U.S.C. 119, the contents of which are herein incorporated by reference in their entirety.

BACKGROUND

1. Technical Field

The present disclosure relates to a method for manufacturing a photomask and a photomask manufactured using the same.

2. Discussion of the Related Art

Electron beam lithography exposes photomasks using an electron-beam (e-beam) irradiator based on a variable shaped beam (VSB) exposure for high-resolution and high-accuracy patterning. In a VSB exposure, a pattern is exposed using a rectangular or triangular e-beam shot. These exposures make use of a deflector for deflecting the shot to a position desired to be exposed and a high-speed amplifier.

In a VSB exposure, components of the high-speed amplifier may deteriorate due to electronic circuit limitations. The deteriorated high-speed amplifier may output an incorrect voltage. In this case, a pattern may be exposed at a position other than the desired pattern position, resulting in a defective pattern.

SUMMARY

Embodiments of the present disclosure provide a method for manufacturing a photomask, which can efficiently detect a defective pattern by forming an L-shaped defect detecting pattern on a photoresist film.

The present disclosure also provides a photomask manufactured by the method.

These and other objects of the present disclosure will be described in or be apparent from the following description of exemplary embodiments.

According to an aspect of the present disclosure, there is provided a method for manufacturing a photomask, the method including forming a photoresist film on a substrate, and forming a defect detecting pattern on the photoresist film, the defect detecting pattern having a first pattern elongated in a first direction and a second pattern overlapping one end of the first pattern and elongated in a second direction different from the first direction, wherein the first pattern and the second pattern are formed using electron beams (e-beam) diffracted by a same amplifier.

According to another aspect of the present disclosure, there is provided a photomask including a photoresist film formed on a substrate, and a defect detecting pattern formed on the photoresist film, the defect detecting pattern having a first pattern elongated in a first direction and a second pattern overlapping one end of the first pattern and elongated in a second direction different from the first direction.

According to another aspect of the present disclosure, there is provided a method for manufacturing a photomask, the method including forming a photoresist film on a substrate, the photoresist film including a device portion and a peripheral portion surrounding the device portion; and forming a plurality of defect detecting patterns on the peripheral portion of the photoresist film using a electron beam (e-beam). The defect detecting patterns are repeated in a first direction and a second direction different from the first direction, A denotes the first direction pitch and the second direction pitch of the plurality of defect detecting patterns, B denotes a field width of the e-beam, and a smallest natural number C, denoted as C1, is selected such that A×C1 is a natural number and B and A×C1 are relatively prime.

DETAILED DESCRIPTION OF EXEMPLARY EMBODIMENTS

The present disclosure will now be more fully described hereinafter with reference to the accompanying drawings, in which exemplary embodiments of the disclosure are shown. This disclosure may, however, be embodied in different forms and should not be construed as limited to the embodiments set forth herein. The same reference numbers indicate the same components throughout the specification. In the attached figures, the thickness of layers and regions is exaggerated for clarity. It will be understood that when an element or layer is referred to as being "connected to," or "coupled to" another element or layer, it can be directly connected to or coupled to another element or layer or intervening elements or layers may be present. Like numbers refer to like elements throughout.

Figure 1:
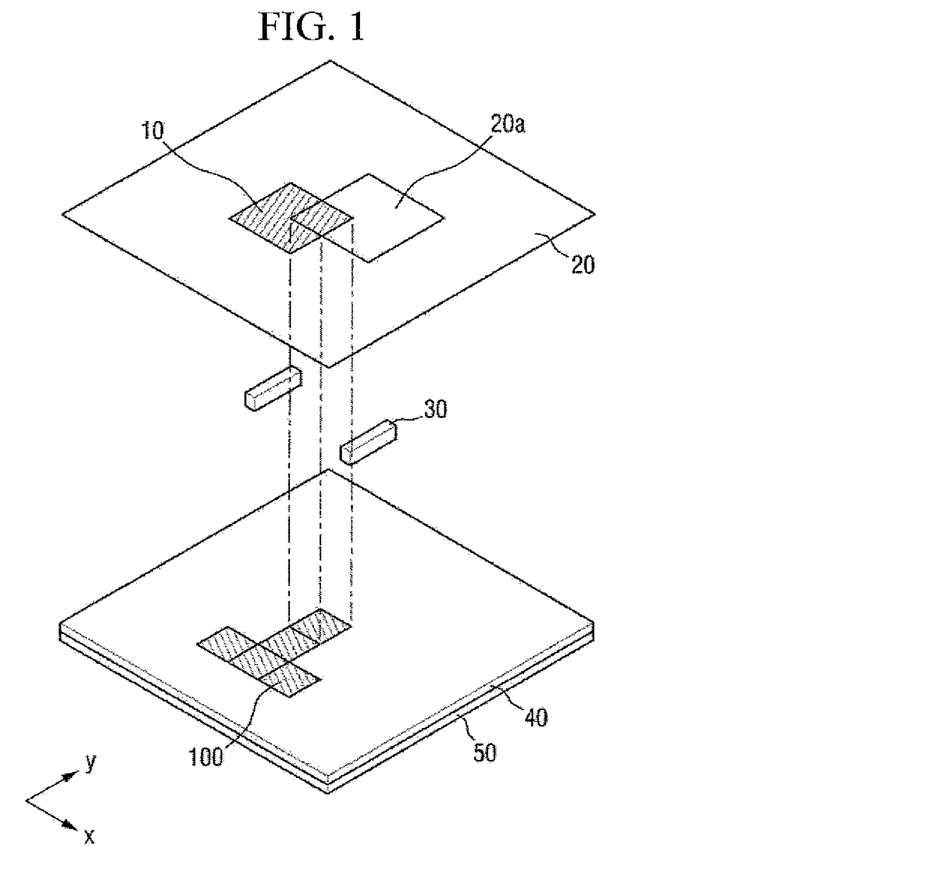
FIG. 1 illustrates a pattern being formed by an e-beam irradiator used in methods for manufacturing a photomask according to embodiments of the present disclosure.
Figure 2:
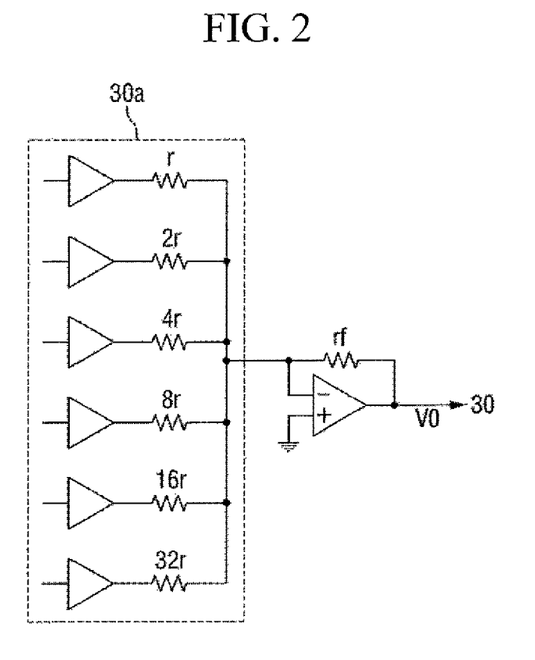
FIG. 2 illustrates an amplifier connected to a deflector deflecting an e-beam in an e-beam irradiator shown in FIG. 1.

First, an e-beam irradiator used in methods for manufacturing a photomask according to embodiments of the present disclosure will be described with reference to FIGS. 1 and 2. FIG. 1 illustrates a pattern being formed by an e-beam irradiator used in methods for manufacturing a photomask according to embodiments of the present disclosure and FIG. 2 illustrates an amplifier connected to a deflector deflecting an e-beam in an e-beam irradiator shown in FIG. 1.

Referring to FIG. 1, an electron beam (e-beam) irradiated from an e-beam irradiator forms a transfer pattern 100 on a photoresist film 40 mounted on a substrate 50. The e-beam irradiator may include a mask 20 having an opening 20a, a deflector 30 and a working stand (not shown).

In detail, the mask 20 allows a pre-electron beam 10 emitted from an electron gun (not shown) to pass and form e-beams irradiated into the photoresist film 40. The pre-electron beam 10 emitted from the electron gun passes another mask (not shown) having a hole positioned over the mask 20. The pre-electron beam 10 having passed through the hole is shaped to be irradiated into the mask 20. The pre-electron beam 10 passes through an opening 20a in the mask 20 to be irradiated onto the photoresist film 40. The e-beam irradiated onto the photoresist film 40 is limited to that portion of the pre-electron beam 10 that passed through the opening 20a in the mask 20. That is to say, a cross-section of the e-beam irradiated onto the photoresist film 40 may vary according to the shape of an overlap area of the pre-electron beam 10 and the opening 20a in the mask 20. The opening 20a in the mask 20 may have, for example, a rectangular shape. An embodiment of the present disclosure will be described for a rectangular shaped opening 20a, but embodiments of the present disclosure are not limited thereto. That is to say, the opening 20a in the mask 20 may have a polygonal shape, such as a triangle, a rectangle or a hexagon, to generate various shaped e-beams irradiated onto the photoresist film 40.

The deflector 30 may change a path of the e-beam passing through the mask 20. That is to say, the deflector 30 deflects the e-beam passing through the mask 20 to direct the e-beam to a pattern forming area of a photoresist film to form a designed pattern and a transfer pattern 100 on the photoresist film 40 by irradiation of the e-beam. The deflector 30 may deflect the path of the e-beam according to an output of an amplifier shown in FIG. 2.

The path of the e-beam can be diffracted by the deflector 30 onto a predetermined region. A field refers to a region reachable by an e-beam diffracted by the deflector 30. The field has widths in x- and y-axis directions, referred to as field widths. In detail, when the substrate 50 is fixed, the substrate 50 cannot be completely exposed by diffracting the e-beam because the size of the substrate 50 is much greater than a diffraction width of the e-beam. In addition, if the diffraction width of the e-beam is made as wide as the substrate 50, accuracy of an exposed pattern may be lowered. Therefore, selected sub-areas of photoresist film 40 are exposed by the diffracted e-beam by moving the substrate 50 upon which the photoresist film 40 is mounted. That is to say, a field refers to the selected sub-area of the photoresist film 40 reachable by the diffracted e-beam without moving a working stand (not shown) on which the substrate 50 is placed. A length of one side of a field is referred to as a field width.

An object to be patterned, such as a substrate with a photoresist film coated thereon, may be placed on the working stand (not shown). The working stand may move in x and y directions while forming a pattern. Therefore, the object can be moved by the working stand relative to the diffracted e-beam, thereby forming various patterns on the object while a path of the e-beam is fixed in one direction.

Referring to FIG. 1, the e-beam passing through the opening 20a in the mask 20 is irradiated onto the photoresist film 40 via the deflector 30. The shape of the transfer pattern 100 formed on the photoresist film 40 changes due to the e-beam irradiation. The transfer pattern 100 shape results from the overlap of the pre-electron beam 10 and the opening 20a, that is, the cross-sectional shape of the e-beam. To transfer a designed pattern onto the photoresist film 40, the e-beam is diffracted using the deflector 30. The transfer pattern 100 is formed on the photoresist film 40 using the diffracted e-beam. In FIG. 1, the designed pattern is a T-shaped pattern. To implement the designed pattern, a plurality of e-beams having rectangular cross-sections are irradiated onto the photoresist film 40. Hereinbelow, an e-beam having rectangular cross-sectional shape may be referred to as a rectangularly shaped e-beam. To form the designed T-shaped patterns within a field, the e-beams are diffracted by the deflector 30 to be irradiated onto predetermined positions of the photoresist film 40. Here, the e-beams are irradiated onto the predetermined positions of the photoresist film 40 to form the transfer pattern 100 by adjusting the output of an amplifier connected to the deflector 30.

Referring to FIGS. 1 and 2, an amplifier 30a connected to the deflector 30 provides an output derived from an input signal to the deflector 30. The amplifier 30a is a digital-to-analog converter amplifier (DACAmp) that converts a digital signal into an analog signal. The amplifier 30a supplies different signals to the deflector 30 according to the shape and position of the designed pattern. After receiving the signals, the deflector 30 diffracts the e-beams to form the transfer pattern 100 on the photoresist film 40. Since the e-beams are diffracted in x- and y-directions, separate amplifiers 30a for respectively diffracting the e-beams in the x- and y-directions may be connected to the deflector 30. It may be assumed that there are n amplifiers connected to the deflector 30 to diffract the e-beams in one direction. Here, there may be $2^n$ output combinations from the amplifier 30a in one direction and there may be $2^n$ combinations of diffracted e-beams.

Referring to FIG. 2, 6 amplifiers are connected to the deflector 30, but the present disclosure does not limit the number of amplifiers thereto. The number of outputs from the 6 amplifiers may be $2^6$ (that is, 64), and there may be 64 combinations of diffracted e-beams. That is to say, the e-beams may be diffracted to 64 different positions in one direction, and the transfer pattern may be formed according to the diffracted e-beams. If the number of amplifier outputs to be supplied to the deflector is increased, a transfer pattern more similar to the designed pattern can be formed on the photoresist film 40.

Referring to FIG. 2, it may be assumed that one of the 6 amplifiers malfunctions and supplies an incorrect signal to the deflector 30. That is to say, correct signals are supplied from 5 amplifiers to the deflector 30 while an incorrect signal is supplied from the malfunctioning amplifier. Then, the outputs associated with the malfunctioning amplifier that are supplied to the deflector 30 include $2^5$ (=32) incorrect signals. The deflector 30 supplied with the incorrect signals diffracts the e-beams to positions deviated from the correct positions. The incorrectly diffracted e-beams form a transfer pattern on the photoresist film 40 that differs from the designed pattern, rendering defective the entire transfer pattern formed on the photoresist film 40.

Figure 3A:
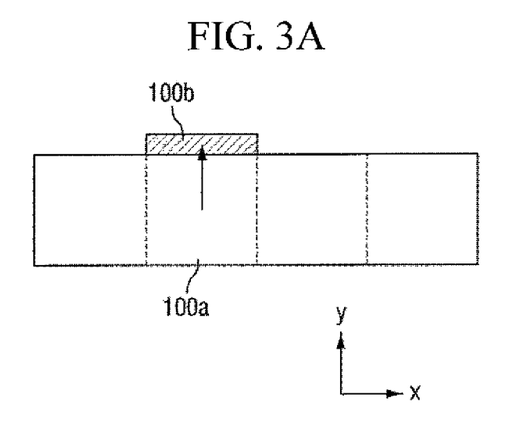
FIGS. 3A to 3C illustrate defective patterns formed by incorrect signals from the amplifier connected to the deflector shown in FIG. 1.
Figure 3B:
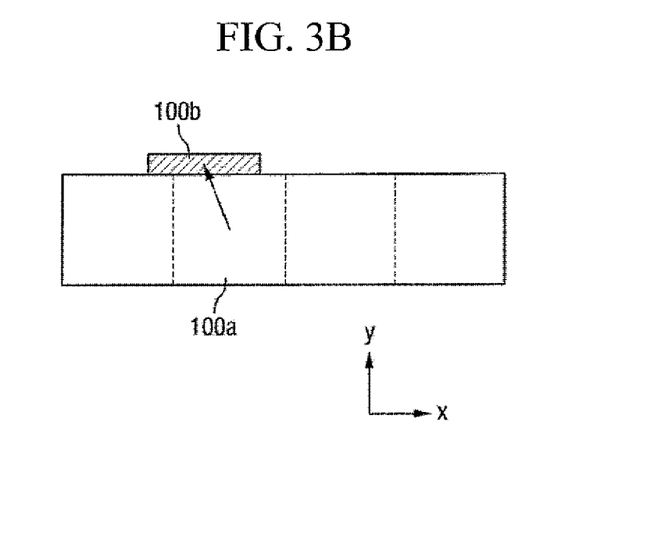
Figure 3C:
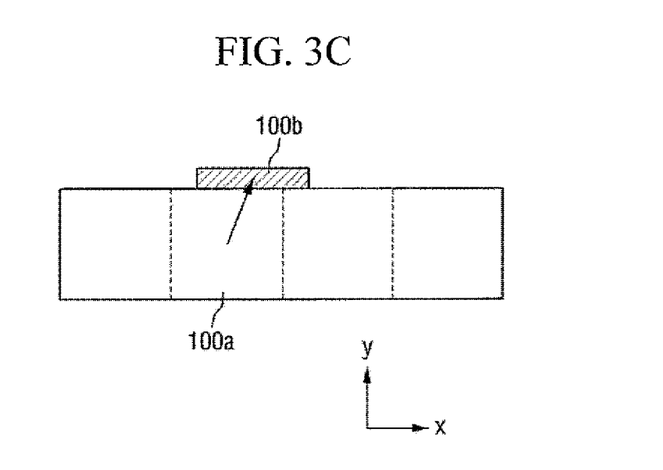

The designed pattern and the defective transfer pattern formed by the incorrect amplifier signals will be described with reference to FIGS. 3A to 3C. FIGS. 3A to 3C illustrate defective patterns formed by incorrect signals from the amplifier connected to the deflector shown in FIG. 1.

Referring to FIGS. 3A to 3C, a designed pattern is shaped as a rectangle elongated in the x-direction. A pattern elongated in the x-direction is formed according to the designed pattern. The pattern elongated in the x-direction is equivalent to a plurality of unit squares arranged in the x-direction. To form a pattern elongated in the x-direction, a transfer pattern 100a of the unit square may be continuously formed in the x-direction. The contiguous transfer patterns 100a of unit squares have the same shape as a transfer pattern elongated in the x-direction. In FIG. 1, a first e-beam passing through the mask 20 opening 20a is irradiated to form the unit square transfer pattern 100a at a predetermined position. Thereafter, to continuously form unit square transfer patterns in the x-direction, a second e-beam obtained by diffracting the first e-beam is irradiated onto the photoresist film 40. The irradiated second e-beam forms a unit square transfer pattern in contact with the unit square transfer pattern 100a formed by the first e-beam. In this way, the unit square transfer patterns are formed on the photoresist film 40, thereby forming a transfer pattern elongated in the x-direction.

Referring to FIGS. 1 and 3, the e-beam passing through the mask 20 opening 20a may be incorrectly diffracted by the deflector 30 due to the incorrect signal from the malfunctioning amplifier, thereby forming a defective transfer pattern. The defective transfer pattern may have a displacement 100b in a y-direction with respect to the normal transfer pattern 100a. FIG. 3A shows that an amplifier associated with diffracting the e-beam in the y-direction is defective because the transfer pattern 100a of unit rectangle has a displacement 100b in the y-direction. FIGS. 3B and 3C show that at least two amplifiers associated with diffracting the e-beams in the x- and y-directions are defective, since the transfer pattern 100a of unit rectangle undergoes a displacement 100b in the x- and y-directions.

Referring to FIG. 3, a pattern elongated in the x-direction can be used as a defect detecting pattern if the defect detecting pattern has a displacement 100b in the y-direction. However, it is challenging to quickly determine a pattern defect with the formed transfer pattern, thereby lowering the defect detection rate. In addition, it is also challenging to quickly find the amplifier associated with the pattern defect, thereby lowering processing efficiency.

Hereinafter, a method for manufacturing a photomask according to an embodiment of the present disclosure will be described with reference to FIGS. 1, 2 and 4 to 7c.

Figure 4:
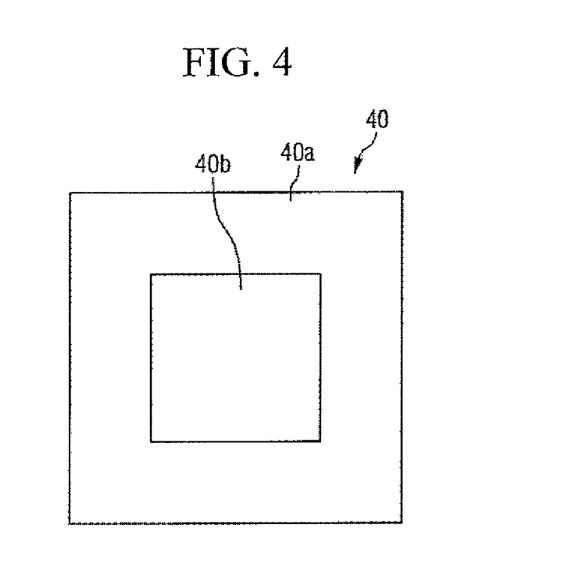
FIG. 4 illustrates a photoresist film used in a method for manufacturing a photomask according to an embodiment of the present disclosure.
Figure 5:
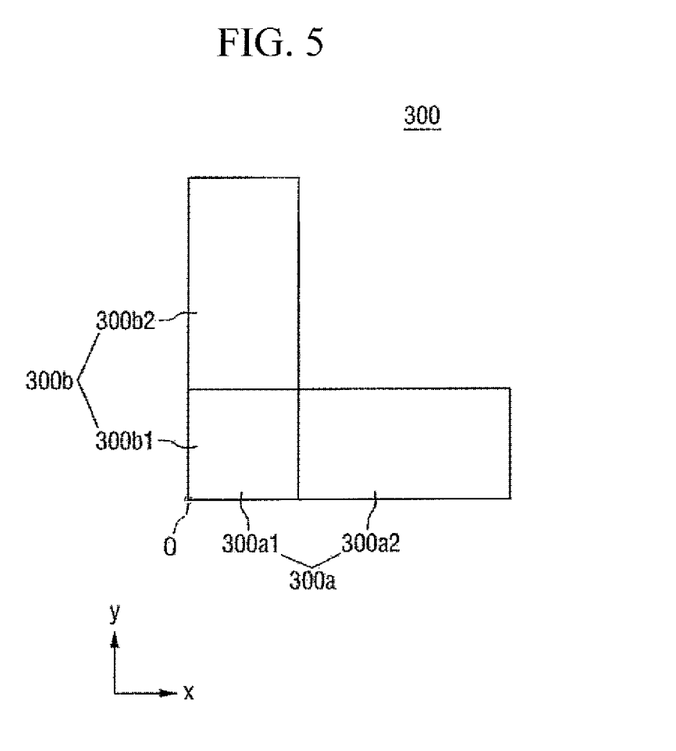
FIG. 5 illustrates a defect detecting pattern used in a method for manufacturing a photomask according to an embodiment of the present disclosure.
Figure 6A:
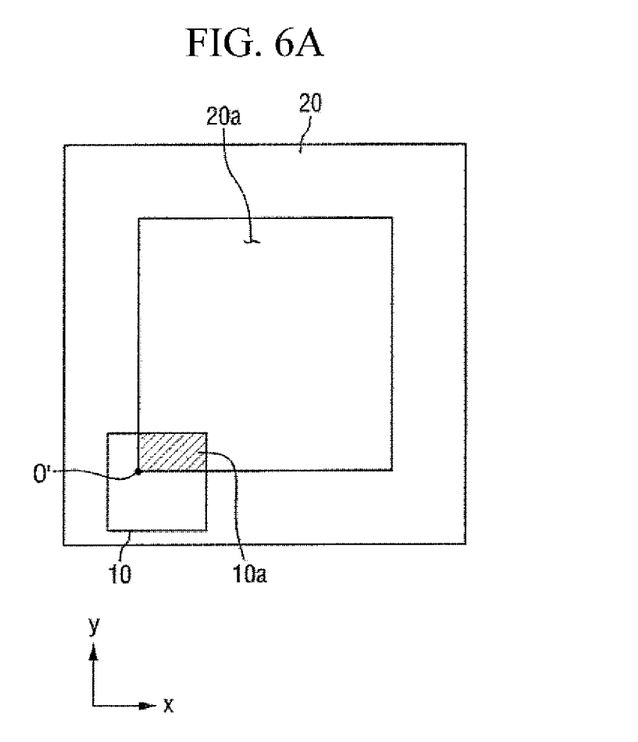
FIGS. 6A and 6B illustrate a positional relationship between an opening in a mask for forming the defect detecting pattern shown in FIG. 5 and a pre-electron beam.
Figure 6B:
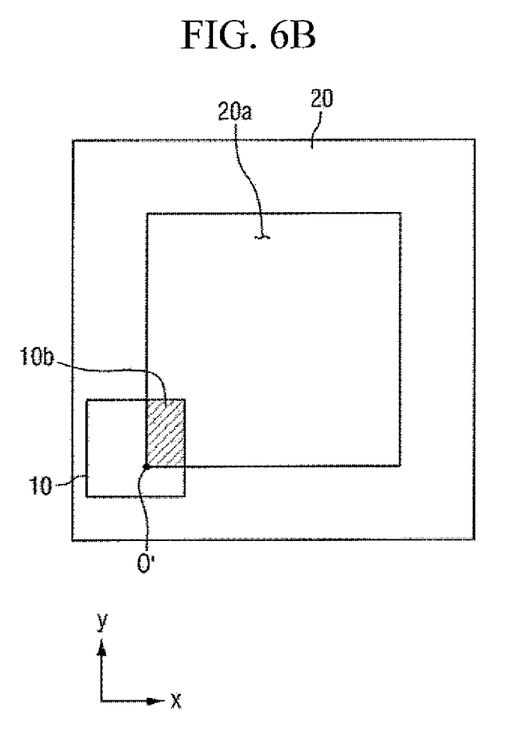
Figure 7A:
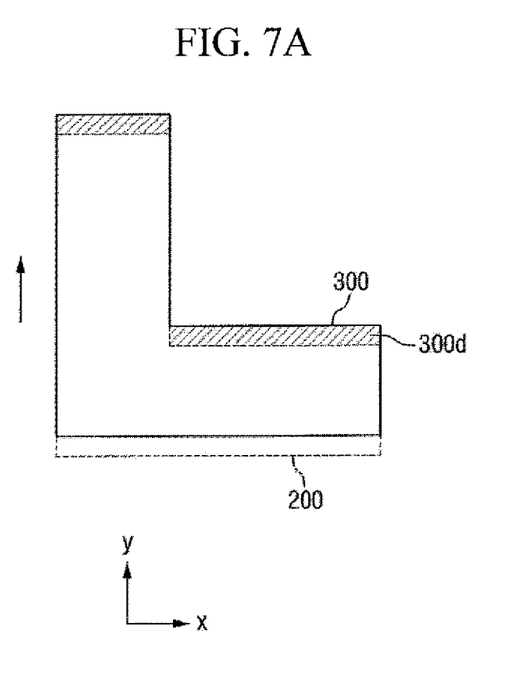
FIGS. 7A to 7C illustrate pattern defects generated in a method for manufacturing a photomask according to an embodiment of the present disclosure.
Figure 7B:
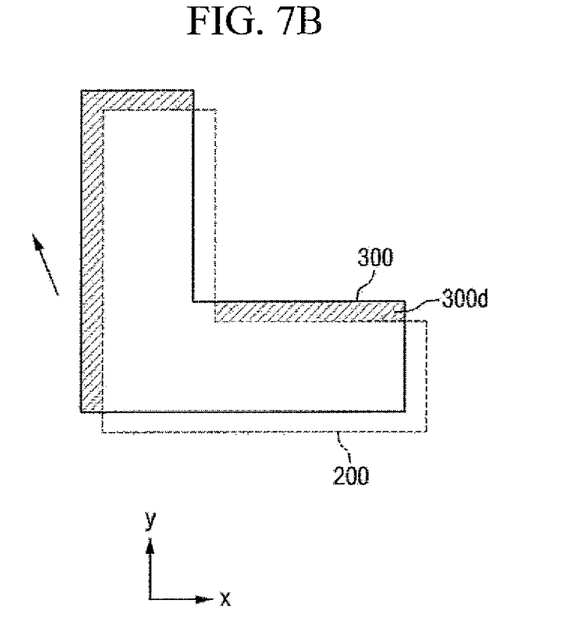
Figure 7C:
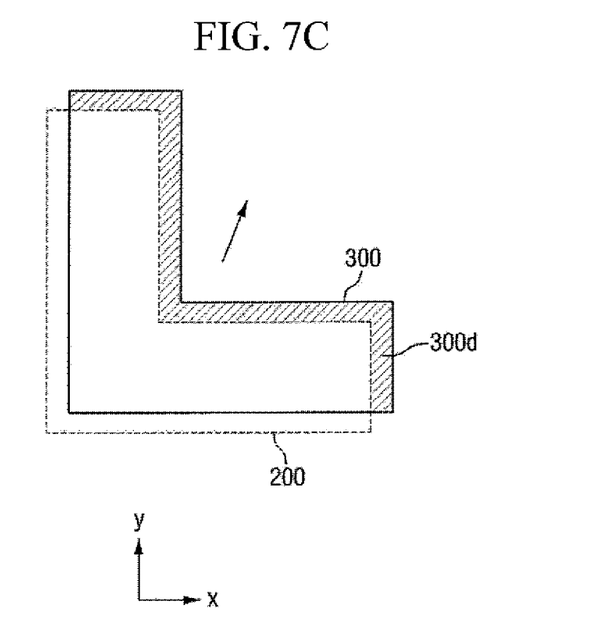

FIG. 4 illustrates a photoresist film used in a method for manufacturing a photomask according to an embodiment of the present disclosure, FIG. 5 illustrates a defect detecting pattern used in a method for manufacturing a photomask according to an embodiment of the present disclosure, FIGS. 6A and 6B illustrate a positional relationship between an opening in a mask for forming the defect detecting pattern shown in FIG. 5 and a free electron beam, and FIGS. 7A to 7C illustrate pattern defects generated in a method for manufacturing a photomask according to an embodiment of the present disclosure.

Referring to FIGS. 1, 2 and 4 to 7c, the photoresist film 40 is formed on the substrate 50, and a device portion 40b and a peripheral portion 40a surrounding the device portion 40b are defined on the photoresist film 40. A defect detecting pattern 300 having a first pattern 300a and a second pattern 300b is formed on the photoresist film 40. The first pattern 300a is formed on the photoresist film 40 elongated in the x-direction on the photoresist film 40. The second pattern 300b overlaps one end 300a1 of the first pattern 300a and is elongated in the y-direction. Here, the formed first pattern 300a and second pattern 300b include first and second patterns formed using the e-beams diffracted by the same amplifier 30a. Whether there is a defect in the defect detecting pattern 300 may be determined by comparing the defect detecting pattern 300 with the designed pattern 200.

Referring to FIGS. 1 and 4, the photoresist film 40 is formed on the substrate 50. Although not shown, a shield film or a semiconductor device, for example, may be formed between the substrate 50 and the photoresist film 40. The device portion 40b and the peripheral portion 40a surrounding the device portion 40b are defined on the photoresist film 40. The substrate 50 may include, for example, a transparent material such as glass or quartz, or a semiconductor substrate. The photoresist film 40 may be a negative photoresist film that remains after developing the e-beam irradiated area, or a positive photoresist film that is removed after developing the e-beam irradiated area.

Referring to FIG. 4, the device portion 40b may be a region where a pattern for implementing, for example, a memory device or a logic device, is formed. The peripheral portion 40a may be used as a region for separating adjacent device portions 40b or as a dicing area when device portions 40b are divided in a semiconductor packaging process. In addition, the peripheral portion 40a may be a region where a defect detecting pattern is formed in forming a photomask. That is to say, the defect detecting pattern may be formed in the peripheral portion 40a that surrounds the device portion 40b.

In the method for manufacturing a photomask according to an embodiment of the present disclosure, the photomask may include a shield film pattern formed on a transparent glass substrate. In addition, the semiconductor substrate upon which the mask pattern is formed may include a semiconductor device pattern.

Referring to FIGS. 4 and 5, the first pattern 300a elongated in the x-direction may be formed on the photoresist film 40, and the second pattern 300b overlapping one end 300a1 of the first pattern 300a and elongated in the y-direction may be formed on the photoresist film 40. The defect detecting pattern 300 for determining whether or not a photomask is defective has the first pattern 300a and the second pattern 300b, and the defect detecting pattern 300 is formed on the photoresist film 40. Alternatively, a defect detecting pattern 300 having a second pattern 300b that overlaps the first pattern 300a at an end 300a1 thereof may have a T-shaped pattern, as shown in FIG. 1. However, a method for manufacturing a photomask according to an embodiment of the present disclosure will be described with regard to an L-shaped pattern rather than a T-shaped pattern. Since a T-shaped pattern may be formed by two L-shaped patterns, the following description for an L-shaped pattern may also be applied to the T-shaped pattern.

Referring to FIG. 5, the first pattern 300a is a rectangle elongated in the x-direction. The first pattern 300a has a first region 300a1 that overlaps the second pattern 300b and a second region 300a2 that does not overlap the second pattern 300b. The second pattern 300b is a rectangle elongated in the y-direction. The second pattern 300b has a third region 300b1 that overlaps the first pattern 300a and a fourth region 300b2 that does not overlap the first pattern 300a. The first region 300a1 and the third region 300b1 coincide, being shared by the first pattern 300a and the second pattern 300b. The second region 300a2 and the fourth region 300b2 may have the same size as the first and third regions 300a1 and 300b1. Alternatively, the second region 300a2 and the fourth region 300b2 may have different sizes from the first and third regions 300a1 and 300b1.

The defect detecting pattern 300 may be an L-shaped pattern as a whole. The L-shaped defect detecting pattern 300 includes first pattern 300a extending in the x-direction and second pattern 300b extending in the y-direction. Here, the x-direction and the y-direction are different from each other. The x-direction may be orthogonal to the y-direction. That is to say, the defect detecting pattern 300 may have first and second patterns 300a and 300b orthogonal to each other. Widths of the defect detecting pattern 300 in the x-direction and the y-direction may vary according to a field width of the e-beam irradiator and a defective pattern detection target rate.

Referring to FIG. 5, the first pattern 300a may have a rectangular shape starting at point O and the second pattern 300b may have a rectangular shape starting at point O. That is to say, the first pattern 300a and the second pattern 300b may be respectively elongated in the x-direction and the y-direction from the same starting point O. In other words, the first pattern 300a elongated in the x-direction and the second pattern 300b elongated in the y-direction have O as the common corner. Therefore, the defect detecting pattern 300 having first and second patterns 300a and 300b may be an L-shaped polygon extending in the x- and y-directions from the same starting point O, respectively. In the method for manufacturing a photomask according to an illustrated embodiment of the present disclosure, the starting points O of the first pattern 300a and the second pattern 300b are the same, but embodiments of the present disclosure are not limited thereto. That is to say, the first pattern 300a and the second pattern 300b may have rectangular shapes having different starting points.

A method for irradiating an e-beam to form the defect detecting pattern 300 will now be described with reference to FIGS. 1, 2, 6A and 6B. The pre-electron beam 10 emitted from an electron gun (not shown) is irradiated onto the mask 20. The pre-electron beam 10 irradiated onto the mask 20 passes through another mask positioned on the mask 20 that determines its cross-section. In FIGS. 6A and 6B, the pre-electron beam 10 irradiated onto the mask 20 is that portion of the e-beam that passed through a rectangular hole to have a rectangular cross section. The cross-section of the e-beam irradiated onto the photoresist film 40 may have the same shape as the overlapping areas 10a and 10b of the pre-electron beams 10 and the opening 20a in the mask 20. The pattern formed on the photoresist film 40 may have the same shape as the cross-sectional shape of the e-beam irradiated onto the photoresist film 40. Therefore, the shape of the pattern formed on the photoresist film 40 may be adjusted by adjusting the shapes of the overlapping areas 10a and 10b of the pre-electron beams 10 and the opening 20a in the mask 20.

Referring to FIGS. 6A and 6B, a rectangularly shaped pre-electron beam 10 passes through the opening 20a in the mask 20. The pre-electron beams 10 emitted from the electron gun may be irradiated to different positions of the mask 20 by a shaping deflector (not shown) that changes the path of the pre-electron beam 10 between the mask 20 and the electron gun. The e-beam passing through the opening 20a may have the cross-sectional shape of a first rectangle 10a elongated in the x-direction or a second rectangle 10b elongated in the y-direction. The first rectangle 10a and the second rectangle 10b are elongated in different directions but have the same corner O'. An e-beam having the cross-sectional shape of the first rectangle 10a is irradiated onto the photoresist film to form a first pattern (300a of FIG. 5) elongated in the x-direction. In addition, an e-beam having the cross-sectional shape of the second rectangle 10b is irradiated onto a photoresist film to form a second pattern (300b of FIG. 5) elongated in the y-direction. However, the present disclosure does not limit the shapes of the e-beams for forming the first and second patterns to those illustrated herein. In a method for manufacturing the photomask according to an illustrated embodiment of the present disclosure, the e-beam passing through the opening 20a in the mask 20 may have a reduced cross section, but is not rotated.

Referring to FIGS. 1, 2 and 5 to 6B, the e-beam passing through the opening 20a and having a first rectangular cross-sectional shape 10a is diffracted by the deflector 30 to form the first pattern 300a on the photoresist film 40. The e-beam passing through the opening 20a and having a second rectangular cross-sectional shape is diffracted by the deflector 30 to form the second pattern 300b on the photoresist film 40. In such a manner, the defect detecting pattern 300 having the first pattern 300a and the second pattern 300b is formed on the photoresist film 40. E-beams having the cross-sectional shape of the first rectangle 10a and e-beams having the cross-sectional shape of the second rectangle 10b form the first and second patterns 300a on the photoresist film 40 by being differentially diffracted. That is to say, the diffraction extent of the e-beams by the deflector 30 is related to output magnitudes of the amplifier 30a connected to the deflector 30. Therefore, the diffraction of the e-beam may be increased by increasing the output of the amplifier 30a, and may be reduced by decreasing the output of the amplifier 30a. In FIGS. 6A and 6B, when an e-beam having a first rectangular 10a cross-sectional shape and an e-beam having a second rectangular 10b cross-sectional shape 10b are differentially diffracted, the defect detecting pattern 300 may not be the L-shaped pattern shown in FIG. 5.

Therefore, a method for manufacturing a photomask according to an embodiment of the present disclosure is described with regard to a case where the e-beams irradiated onto the photoresist film 40 to form the defect detecting pattern 300 are equivalently diffracted. The diffraction extent of the e-beams by the deflector 30 are substantially equal to each other because input signals to the deflector 30 supplied from the amplifier are the same. In other words, the substantially equal outputs of the amplifier 30a may mean that the amplifiers associated with the outputs are equivalent to each other. The defect detecting pattern 300 may include the first pattern 300a and the second pattern 300b having a common corner O due to the e-beams being diffracted by the deflector 30 supplied with the outputs from the same amplifier. As described above, the first pattern 300a and the second pattern 300b share the corner O because the overlapping areas 10a and 10b of the pre-electron beams 10 and the opening 20a have the corner O' in common. In addition, the first pattern 300a and the second pattern 300b share the corner O because the e-beams are diffracted by the deflector 30 supplied with the outputs from the same amplifier.

Referring to FIGS. 7A to 7C, it may be determined whether there is a defect in the defect detecting pattern 300 by comparing the defect detecting pattern 300 with a designed pattern 200. A displacement 300d may be generated in the x-direction or the y-direction between the designed pattern 200 and the defect detecting pattern 300 formed on the photoresist film. A displacement refers to a non-overlapping area of the designed pattern 200 and the defect detecting pattern 300. If the displacement 300d occurs in the defect detecting pattern 300 with respect to a position of the designed pattern 200, it is determined that there is a defect in the formed pattern. That is to say, if the displacement 300d occurs in the defect detecting pattern 300 relative to the position of the designed pattern 200, it may be determined that the formed pattern is defective. The comparing of the designed pattern 200 with the defect detecting pattern 300 may be performed by determining whether there is a displacement of the formed pattern by overlapping an image of the defect detecting pattern 300 with the designed pattern.

To form substantially the same pattern as the designed pattern, the e-beam passing through the mask should be accurately diffracted by the deflector so that the displacement 300d is not generated, in which case the designed pattern 200 and the defect detecting pattern 300 are substantially equivalent with each other. However, the amplifier connected to the deflector is an electronic part that may deteriorate and the deteriorated electronic part may output an incorrect signal to the deflector (30 of FIG. 1). The deflector supplied with the incorrect signal incorrectly diffracts the e-beam to a position different from that of the designed pattern. The erroneously diffracted e-beam may form a defective pattern.

Referring to FIGS. 5 and 7A, the defect detecting pattern 300 has been displaced from the designed pattern 200 in the y-direction. That is to say, the first pattern 300a and the second pattern 300b are displaced from the designed pattern 200 in the y-direction. Therefore, the displacement 300d of the defect detecting pattern 300 is generated in the +y-direction of the designed pattern 200. The displacement direction confirms that the e-beam irradiated to form the second pattern 300b has been erroneously diffracted. It can be determined by the erroneous diffraction of the e-beam that a malfunctioning amplifier is supplying outputs to the deflector. Therefore, it is possible to determine that there is a malfunction in the amplifier connected to the deflector that diffracts the e-beam in the y-direction to form the defect detecting pattern 300 by detecting the displacement 300d direction. If the defect detecting pattern 300 includes a plurality of defect detecting patterns, different amplifiers may be used to supply outputs to form the respective defect detecting patterns. Therefore, when a position of a defective pattern is determined, the particular amplifiers associated with the defective pattern can be detected, as will now be described in detail.

Referring to FIGS. 5, 7B and 7C, the defect detecting pattern 300 has been displaced from the designed pattern 200 in the x- and y-directions. That is to say, the first pattern 300a and the second pattern 300b are displaced from the designed pattern 200 in the x- and y-directions. In FIG. 7B, the displacement 300d of the defect detecting pattern 300 is generated in the +y- and −x-directions with respect to the designed pattern 200. This suggests that a pattern defect is generated due to the displacement of the defect detecting pattern 300 from the designed pattern 200 in the −x- and +y-directions. The displacement directions confirm that the e-beam irradiated to form the second pattern 300b has been erroneously diffracted. It is possible to determine that there is a malfunction in the amplifier connected to the deflector that diffracts the e-beam in the x- and y-directions by detecting the displacement directions. In FIG. 7C, the displacement 300d of the defect detecting pattern 300 is generated in the +y- and +x-directions with respect to the designed pattern 200. This suggests that a pattern defect is generated due to the displacement of the defect detecting pattern 300 in the +x- and +y-directions from the designed pattern 200. Therefore, it is possible to determine that there is a malfunction in the amplifier connected to the deflector that diffracts the e-beam in the x- and y-directions by detecting the displacement 300d directions.

Hereinafter, effects of using an L-shaped pattern as a defect detecting pattern will be described.

First, referring to FIG. 5, the L-shaped defect detecting pattern 300 is elongated in the x-direction and the y-direction and has a shared corner O. As described above, the L-shaped pattern is formed by overlapping the first pattern 300a of the x-direction and the second pattern 300b of the y-direction. As shown in FIGS. 6A and 6B, if the first and second rectangularly shaped e-beams 10a and 10b are diffracted by the same amplifier, the L-shaped pattern shown in FIG. 5 is formed. An error in the thus-formed L-shaped defect detecting pattern is a result of a particular output of a particular amplifier connected to the deflector. Here, it is also possible to determine whether there is a malfunction in the amplifier for the x-direction or the y-direction. If a defective pattern is detected from a plurality of L-shaped defect detecting patterns, it is possible to determine a particular amplifier associated with the defective pattern. Next, since the L-shaped defect detecting pattern has a larger area than a linear defect detecting pattern, a displacement and its direction can be easily found. Therefore, the L-shaped pattern can improve a defective pattern detection ratio.

A method for manufacturing the photomask according to another embodiment of the present disclosure will be described with reference to FIGS. 1, 2, 4, 8 and 9.

Figure 8:
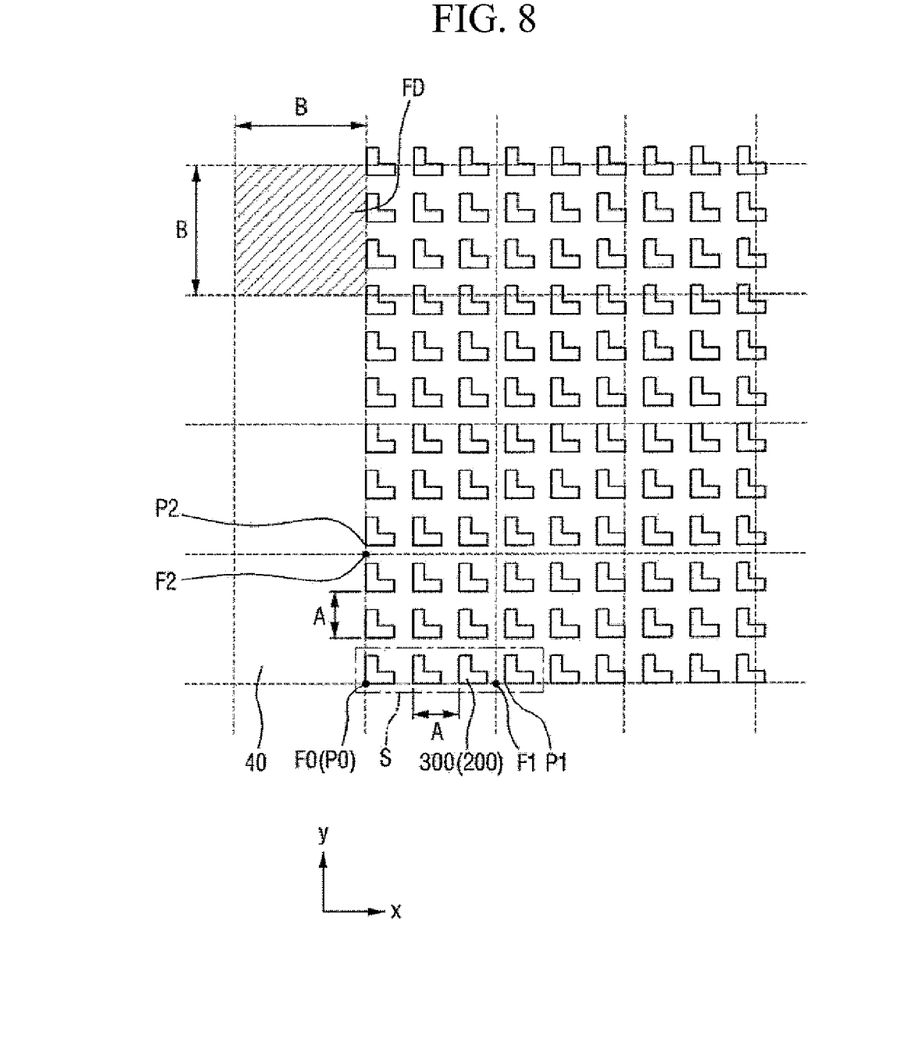
FIG. 8 illustrates a plurality of L-shaped patterns formed in a peripheral portion of a photomask by a manufacturing method according to another embodiment of the present invention.
Figure 9:
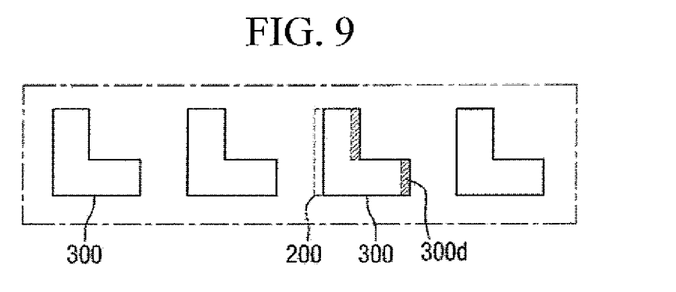
FIG. 9 is an enlarged view of an 'S' portion of FIG. 8.

FIG. 8 illustrates a plurality of L-shaped patterns formed in a peripheral portion of a photomask in a manufacturing method according to another embodiment of the present disclosure and FIG. 9 is an enlarged view of an 'S' portion of FIG. 8.

Referring to FIG. 8, a field FD having a predetermined size is repeatedly defined in a peripheral portion on a photoresist film 40. The field FD has a field width of, for example, B (μm) in the x-direction and the y-direction. In the illustrated embodiment, the field widths in the x-direction and the y-direction equal each other, that is, B, however this is for ease of illustration and embodiments of the present disclosure are not limited thereto. A plurality of defect detecting patterns 300 are formed on the photoresist film 40. The defect detecting patterns 300 may have, for example, an L shape. The plurality of defect detecting patterns 300 may have the same pitch in the x-direction and the y-direction, however, this is for ease of illustration. Alternatively; the plurality of defect detecting patterns 300 may have different pitches in the x-direction and the y-direction. Here, the pitch refers to a distance for which defect detecting patterns 300 are repeatedly formed, and the x-direction pitch and the y-direction pitch may equal each other, that is, A (μm).

Referring to FIG. 8, a relationship between the pitch and field width of the defect detecting pattern 300 formed on the photoresist film 40 will now be described. That is to say, amplifier outputs supplied to the deflector when the defect detecting pattern is formed in a field may be maximized by adjusting the pitch A and the field width B of the defect detecting pattern. For example, in a case where there are 17 amplifiers connected to diffract the e-beam in the x-direction, it may be determined whether or not the $2^{17}$ possible amplifier outputs are normal by adjusting the relationship between the pitch A and the field width B of the defect detecting pattern. First, the pitch A of the defect detecting pattern is multiplied by an arbitrary number C selected so that A×C is a natural number. There are many possible values of C for which A×C is a natural number. Let the smallest such natural number C be denoted by C1. Thereafter, a photomask is manufactured so that A×C1 and B are relatively prime. By manufacturing the photomask in such a manner, it is possible to determine at once how many amplifiers are normal.

Referring to FIG. 8, a defect detecting pattern 300 is formed on a photoresist film 40 such that a corner P0 of an L-shaped pattern is positioned at a corner F0 of a first field. The defect detecting pattern may be continuously formed in the x-direction with a pattern pitch A. However, the defect detecting pattern 300 may be formed on a photoresist film 40 such that a corner P1 of another L-shaped pattern is not positioned at a corner F1 of a second field adjacent to the first field in the x-direction. The e-beams diffracted by amplifiers having the same output are irradiated onto the same position in the field. The corner F1 of the second field and the corner P1 of the pattern are alternately formed to design the pattern so as to determine how many amplifiers are normal. For example, to form a defect detecting pattern having a corner P0, it may be assumed that a 5 V output is required for the amplifier associated with diffraction in the x-direction. Then, to form a defect detecting pattern having a corner P1, a pattern may be designed that requires a 5.001 V output for the amplifier. In addition, the defect detecting pattern may be continuously formed in the y-direction with a pattern pitch of A. However, the defect detecting pattern 300 may be formed such that a corner P2 of another L-shaped pattern is not positioned at a corner F2 of a third field adjacent to the first field in the y-direction. For example, to form a defect detecting pattern having a corner P0, it is assumed that a 5 V output is required for the amplifier associated with diffraction in the y-direction. Then, to form a defect detecting pattern having a corner P2, a pattern may be designed that requires a 5.001 V output for the amplifier.

Hereinafter, a method of determining the pitch A of the defect detecting pattern using specific numbers will be described.

For example, it may be assumed that the field width B is 18 and the pitch A of the defect detecting pattern is 1.4. Prime factorization of the field width B produces prime factors of 2 and 3. There are numerous values of C for which the product A×C is a natural number, including 5, 10, 15 . . . . However, among the numerous C's, the smallest natural number C1 is 5. The product of the pitch A and C1 is 7, which is relatively prime with the field width B, i.e., 18. This will now be described with reference to FIG. 8. The corner P0 of the L-shaped pattern is formed at the corner F0 of a field. Thereafter, a corner of the defect detecting pattern is repeatedly formed at the field corner of the same position after the field is repeated 7 times, or after 90 (=5×18=A×C1×(B/A)=C1×B) defect detecting patterns 300 are formed. In terms of the field definition, e-beams are irradiated onto the same position of a field when the same output is supplied from the amplifier connected to the deflector. Therefore, when the field width B is 18 and the pitch A of the defect detecting pattern is 1.4, it is possible to check whether or not the 90 amplifier outputs are normal.

Alternatively, it may be assumed that the field width B is 18 and the pitch A of the defect detecting pattern is 1.111. Prime factorization of the field width B produces prime factors of 2 and 3. There are numerous C's for which the product A×C is a natural number, including 1000, 2000, 3000 . . . . However, among the numerous C's, the smallest natural number C1 is 1000. The product of the pitch A and C1 is 1111(=11×101), which is relatively prime with the field width B, i.e., 18. This will now be described with reference to FIG. 8. The corner P0 of the L-shaped pattern is formed at the corner F0 of a field. Thereafter, a corner of the defect detecting pattern is repeatedly formed at the field corner of the same position after the field is repeated 1111 times, so that 18000 (=1000×18) defect detecting patterns 300 are formed. In terms of the field definition, when the field width B is 18 and the pitch A of the defect detecting pattern is 1.111, it is possible to check whether or not the 18000 amplifier outputs are normal.

The two cases can be compared to each other assuming that the field widths B are equal in both cases, however, it is important to determine the pitch A of the defect detecting pattern. The product of the pitch A of the defect detecting pattern and C1 is relatively prime with the field width B, and it is possible to determine whether or not the amplifier outputs are normal as a difference between A×C1 and B becomes larger. In general, the e-beams have a wavelength in a range of about 0.001 to about 5 nm and a resolution of about 0.2 nm or greater. In view of these e-beam characteristics, numerous defect detecting pattern pitches A can be realized, which can determine whether or not an amplifier producing the outputs is normal. Here, to measure a displacement for determining whether or not a pattern is defective, the pattern should have a predetermined width.

Referring to FIGS. 2 and 9, a defect is detected from a pattern among multiple defect detecting patterns 300. A displacement 300*d* of the defective pattern is generated in the x-direction while no displacement is generated in the y-direction, thereby determining that the amplifier associated with forming the defective pattern is defective. In detail, different outputs are produced from the amplifier 30*a* that are associated with forming the 4 defect detecting patterns shown in FIG. 9. In terms of the field definition, to irradiate e-beams, different outputs should be produced from the amplifier, which will now be described in more detail referring to FIG. 2.

Here, it may be assumed that an amplifier with a resistance of 4r is defective.

In FIG. 9, the defect detecting pattern 300 that is displaced with respect to the designed pattern 200 is formed by e-beams diffracted by the amplifier with a resistance of 4r. In addition, there are $2^{6-1}$ (=32) possible output combinations affected by the amplifier with the 4r resistance. Therefore, 32 defective patterns, including the defective pattern shown in FIG. 9, are associated with the amplifier with the 4r resistance. It can be determined whether or not the amplifier is defective by detecting a pattern having a displacement when overlapping the designed pattern 200 and the defect detecting pattern 300.

A photomask according to an embodiment of the present disclosure will be described with reference to FIG. 10 and descriptions that would otherwise repeat those presented with regard to FIGS. 4 to 9 will brief or omitted.

Figure 10:
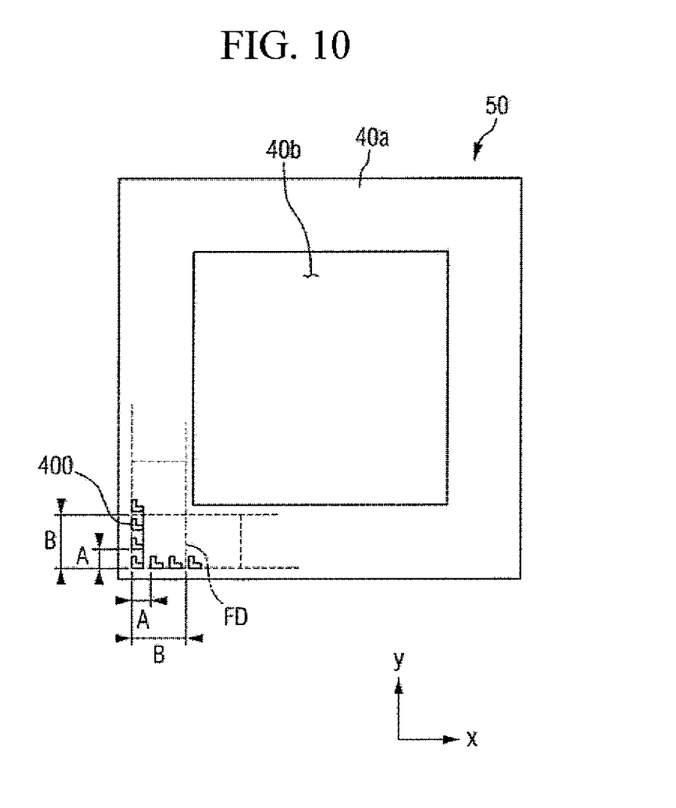
FIG. 10 illustrates a plurality of L-shaped patterns formed in a peripheral portion of a photomask according to an embodiment of the present disclosure.

FIG. 10 illustrates a plurality of L-shaped patterns formed in a peripheral portion of a photomask according to an embodiment of the present disclosure.

Referring to FIG. 10, a substrate 50 is provided. The substrate 50 includes a device portion 40*b* and a peripheral portion 40*a* surrounding the device portion 40*b*. A field is repeatedly defined in the peripheral portion 40*a* in the x- and y-directions, and a length of a field width, corresponding to one side of the field, may be, for example, B (μm). In the peripheral portion 40*a*, a plurality of defect detecting patterns 400 are repeatedly formed in the x- and y-directions. A pitch of the defect detecting patterns 400 in the x-direction and a pitch of the defect detecting patterns 400 in the y-direction may be equal, that is, A (μm).

A relationship between the pitch A and the field width B of the defect detecting pattern 400 will now be described. That is to say, the pitch A is multiplied by an arbitrary number C so that A×C is a natural number. There are numerous values of C for which A×C is a natural number. Let the smallest such natural number C be denoted by C1. Thereafter, A×C1 and B should be relatively prime.

Referring to FIG. 10, the defect detecting pattern 400 formed in the peripheral portion 40*a* on the substrate 50 includes a first pattern 300*a* elongated in the x-direction and a second pattern 300*b* overlapping one end of the first pattern 300*a* and elongated in the y-direction. The defect detecting pattern 400 may be, for example, an L-shaped pattern, but is not limited thereto. The x-direction in which the L-shaped pattern is elongated may be orthogonal to the y-direction.

In detail, the substrate 50 may include, for example, a transparent material such as glass or quartz, or a semiconductor substrate including a semiconductor device pattern. The defect detecting pattern 400 may be a pattern formed on the photoresist film as shown in FIGS. 4 to 9. The defect detecting pattern 400 may be formed of an insulating material used as, for example, a shield film or a mask pattern, but is not limited thereto.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the disclosure.

What is claimed is:

1. A method for manufacturing a photomask, the method comprising:
   forming a photoresist film on a substrate, the photoresist film including a device portion and a peripheral portion surrounding the device portion; and
   forming a plurality of defect detecting patterns on the peripheral portion of the photoresist film using a electron beam (e-beam), wherein the defect detecting patterns are repeated in a first direction and a second direction different from the first direction,
   wherein A denotes the first direction pitch and the second direction pitch of the plurality of defect detecting patterns, B denotes a field width of the e-beam, and a smallest natural number C, denoted as C1, is selected such that A×C1 is a natural number and B and A×C1 are relatively prime.

2. The method of claim 1, wherein each defect detecting pattern has a first pattern elongated in a first direction and a second pattern overlapping one end of the first pattern and elongated in a second direction different from the first direction, and
   wherein the first pattern and the second pattern are formed using electron beams (e-beam) diffracted by a same amplifier.

3. The method of claim 2, further comprising determining whether or not the defect detecting pattern is defective by comparing a defect detecting pattern with a designed pattern, wherein if the defect detecting pattern has a displacement with respect to the designed pattern, it is determined to be defective.

4. The method of claim 3, wherein a displacement direction of the defect detecting pattern is detected from a portion of the defect detecting pattern that does not overlap the designed pattern, and the amplifier associated with diffracting the e-beams irradiated to form the defect detecting pattern is determined from the portion of the defect detecting pattern that does not overlap the designed pattern.

5. The method of claim 1, wherein the photoresist film includes a device portion and a peripheral portion surrounding the device portion, and the plurality of defect detecting patterns are formed on the peripheral portion of the photoresist film.

6. A method for manufacturing a photomask, the method comprising:
   forming a photoresist film on a substrate; and
   forming a defect detecting pattern on the photoresist film, the defect detecting pattern having a first pattern elongated in a first direction and a second pattern overlapping one end of the first pattern and elongated in a second direction different from the first direction,
   wherein the first pattern and the second pattern are formed using electron beams (e-beam) diffracted by a same amplifier.

7. The method of claim 6, wherein the defect detecting pattern is an L-shaped pattern.

8. The method of claim 7, wherein the photoresist film includes a device portion and a peripheral portion surrounding the device portion defined thereon, and the defect detecting pattern is formed on the peripheral portion.

9. The method of claim 7, wherein the first direction is orthogonal to the second direction.

10. The method of claim 6, further comprising determining whether or not the defect detecting pattern is defective by comparing the defect detecting pattern with a designed pattern.

11. The method of claim 10, wherein if the defect detecting pattern has a displacement with respect to the designed pattern, it is determined that there is defective pattern.

12. The method of claim 11, wherein a displacement direction of the defect detecting pattern is detected from a portion of the defect detecting pattern that does not overlap the designed pattern, and the amplifier associated with diffracting the e-beams irradiated to form the defect detecting pattern is determined from the portion of the defect detecting pattern that does not overlap the designed pattern.

13. The method of claim 6, wherein the defect detecting pattern includes a plurality of defect detecting patterns formed on the photoresist film, and the plurality of defect detecting patterns have a same pitch in the first direction and the second direction.

14. The method of claim 13, wherein when A denotes the first direction pitch and the second direction pitch of the plurality of defect detecting patterns and B denotes a field width of the e-beam, a smallest natural number C such that A×C is a natural number, denoted as C1 is selected wherein B and A×C1 are relatively prime.

* * * * *